United States Patent [19]

Bolger

[11] Patent Number: 5,072,283
[45] Date of Patent: Dec. 10, 1991

[54] PRE-FORMED CHIP CARRIER CAVITY PACKAGE

[76] Inventor: Justin C. Bolger, 27 Rolling La., Dover, Mass. 02172

[21] Appl. No.: 321,750

[22] Filed: Mar. 10, 1989

Related U.S. Application Data

[63] Continuation-in-part of Ser. No. 180,777, Apr. 12, 1988.

[51] Int. Cl.$^5$ .............................................. H01L 23/28
[52] U.S. Cl. ......................................... 357/72; 357/70; 357/75
[58] Field of Search ............................... 357/75, 72, 70

[56] References Cited

U.S. PATENT DOCUMENTS

| | | | |
|---|---|---|---|
| 4,661,886 | 4/1987 | Nelson et al. | 357/75 |
| 4,820,658 | 4/1989 | Gilder, Jr. | 357/70 |
| 4,872,260 | 10/1989 | Johnson et al. | 357/70 |
| 4,903,113 | 2/1990 | Frankeny et al. | 357/70 |

OTHER PUBLICATIONS

IBM Technical Disclosure Bulletin, vol. 28, No. 12, May 1986, "Plastic Ringed High Density 'J' Leaded Chip Carrier".

*Primary Examiner*—Eugene R. LaRoche
*Assistant Examiner*—R. Ratliff
*Attorney, Agent, or Firm*—Bruce F. Jacobs

[57] ABSTRACT

A flexible circuit film is used in a surface mountable pre-formed chip carrier cavity package as a direct interconnect between the integrated circuit chip and external bonding pads on a printed circuit board. The IC chip carrier of the present invention is comprised of a square or rectangular base having a central cavity; an IC chip mounted in the cavity and held therein by an adhesive; a lid having a complementary shape to the upper surface of the base; and a flexible circuit sheet sandwiched between the base and lid. The flexible circuit conforms to the top surface of the base due to various cuts or cutouts therein depending upon the specific package construction. Etched copper circuitry on the flex circuit forms interconnects between I/O pads on the IC chip and the outer periphery of the package. The package enables the use of more than 80 and up to more than 300 I/O leads per chip. The base, circuit film, and lid are bonded together with a suitable adhesive. Later the package may be surface mounted on a conventional printed circuit board by solder connections between the exposed leads at the outer periphery of the package and conductive areas on the PC board surface. Multi-chip packages are also included.

41 Claims, 11 Drawing Sheets

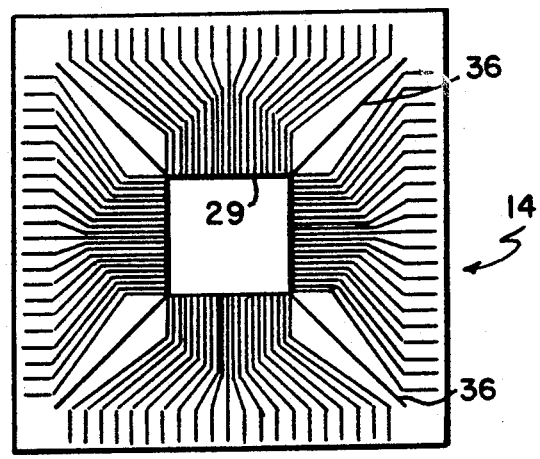
FIG. 3A
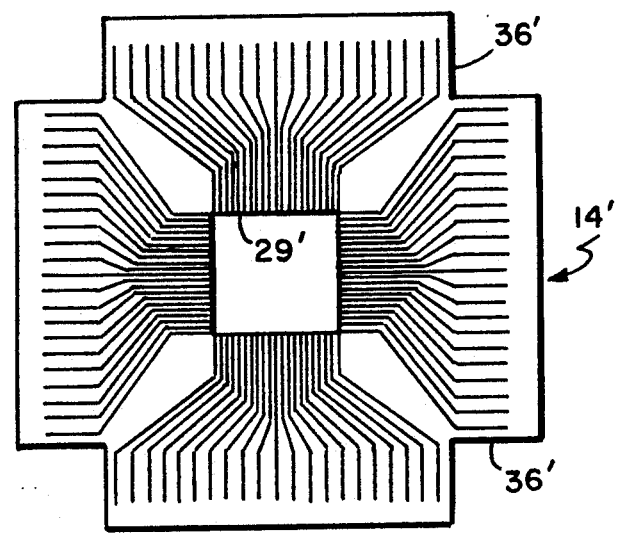
FIG. 3B
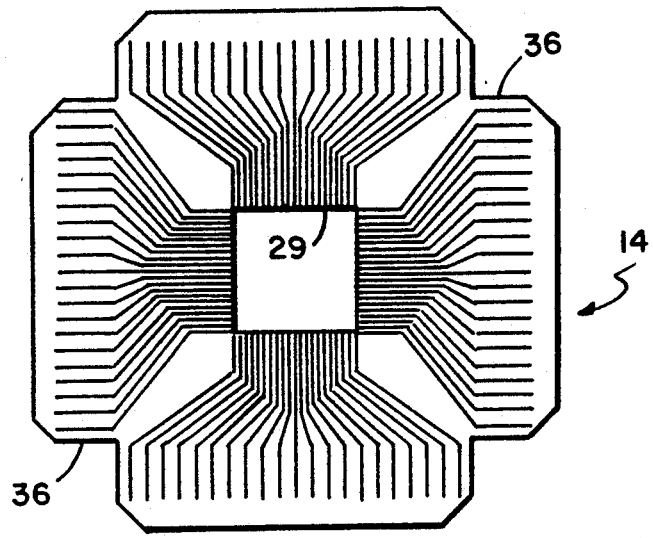
FIG. 3C-D

5,072,283

PRE-FORMED CHIP CARRIER CAVITY PACKAGE

CROSS-REFERENCE TO RELATED APPLICATION

This application is a continuation-in-part of U.S. Ser. No. 07/180,777, filed Apr. 12, 1988.

BACKGROUND OF THE INVENTION

This invention relates generally to the field of packaging and sealing techniques for integrated circuits. More particularly, the invention relates to a surface mountable IC package for an integrated circuit which incorporates a flexible circuit in a pre-formed chip carrier cavity package in which the flexible circuit communicates directly between the integrated circuit within the carrier package and an external circuit.

Packaging and sealing techniques for integrated and hybrid circuits are well known. Generally, an integrated circuit (IC) refers to a single chip or die device which requires only a small cavity or space for packaging the chip. Integrated circuits must be enclosed or packaged for most commercial applications to protect the IC and to connect it into an external circuit. It is common to mount these dies in small plastic or ceramic packages which must somehow be sealed to isolate the die from the atmosphere, moisture, and other contamination which could destroy the circuit or affect its operation. Obviously it is desirable to produce and seal IC packages in high volume at low cost, while maintaining an effectively protected microcircuit.

There are presently three basic types of surface mountable IC packages: post-molded plastic packages, ceramic packages, and pre-molded plastic packages. In most post-molded plastic packages the die is first attached to a metal leadframe and all electrical connections made before the assembly is totally encapsulated with a transfer molding compound, usually an epoxy. This is an inexpensive way to package large quantities of IC's and therefore is presently used for over 80% of all IC packages produced worldwide. However, this method has not been found to be suitable for large dies having high lead counts due to the compressive stresses that occur when the molding compound expands or shrinks due to temperature.

Ceramic packages, usually composed of alumina, consist of a ceramic base and lid which, after firing at above 400° C., form a sealed cavity to hold the die as well as the metal leads which pass through the sides or base of the cavity to connect the die to an external circuit. These packages are excellent for many applications, but the use of them for four-sided high lead count packages has been greatly restricted due to their cost which currently is over $6.00 per package.

Pre-molded plastic packages also consist of a base and a lid which provide a cavity to hold the die. Hence they resemble ceramic packages but are much cheaper due to less expensive materials and because their sealing and assembly is done at relatively low temperatures of less than about 200° C. There are several different types of such packages, which are generally called plastic chip carriers, now being used. Their usage is increasing because they do not require large capital investments by the IC manufacturer and they permit low stress packaging of large dies with high lead counts.

Pre-formed chip carriers which can be surface mounted are particularly desirable for modern manufacturing purposes and FIG. 4 discloses two of the present standard types of such carriers. FIG. 4A shows a "leadless" plastic chip carrier, or PCC 10 comprising a base 12, lid 18 forming therebetween a cavity for housing a die 16 attached to the base 12 by adhesive 34. An adhesive layer 32 seals the base to the lid. Copper circuitry 28 is usually formed in PCC's by electrodepositing copper lines directly on the surface of a plastic base 12 by known direct plating methods. This package is referred to as "leadless" because no metal wires or other leads extend outward from the base 12. The major disadvantage of such a device is that it is unable to adequately dissipate stresses at the connect points 40 on the solder joints 42 which are caused by thermal expansion differences between the package 10 and the mounting surface 24 at the bonding pads 44.

FIG. 4B shows a plastic leaded chip carrier (PLCC). Conventionally, PLCC's have been made by stamping or etching a copper lead frame to make a circuit 29, extending the lead wires out through the adhesive seal 32 between the plastic lid 18 and base 12 and then bending the extended copper leads into a "J" shape to form the solder connect points 40 under the base 12. The major advantage of PLCC's over leadless PCC's is that the copper J-leads are flexible and can accomodate expansion differences between the PLCC and the mounting surface 24 without cracking or stressing the solder joints 42. Hence, PLCC's are now preferred, particularly for packages having 80 or more external leads. With this increasing usage of PLCC's, the industry has found it necessary to standardize package dimensions so that each manufacturer's PLCC will fit precisely on the mounting surface. JEDEC (Joint Electron Device Engineering Council) has set the standards for PLCC's with the most critical dimensions being shown as D and $D_2$ in FIG. 4B. $D_2$ must correspond exactly with the distance between the solder pads on the circuit board shown in FIGS. 2 and 4B. D and $D_2$ depend on lead count and lead pitch. Presently, JEDEC Document MO-047 AA-AH specifies that $D_2 = 0.910''$ $+/- 0.020''$ for PLCC's with 68 outer leads on 50 mil centers and $D_2 = 1.110'' +/- 0/020''$ for PLCC's with 84 outer leads on 50 mil pitch, while $D = 0.990 +/- 0.005$ and $1.190 +/- 0.005$ respectively.

It will be appreciated that a problem in making either of the surface mounted pre-molded packages shown in FIG. 4 has been in the methods utilized to bring the electrical signals from the IC chip to the bond pads on the surface of the circuit board to which the chip is to be attached. One conventional method of so doing is to use a metal lead frame sandwiched between a planar base and the cover as in FIG. 4B. While the use of stamped or etched metal lead frames is acceptable for relatively low lead count chips, as the number of leads has increased and the lead thickness has decreased with increasing circuit complexity, there has developed a need for a simpler, more reliable, less expensive construction method and for more rugged outer leads which will retain their planarity and pitch during production and shipment. Another method of providing electrical communication between the IC chip and the printed circuit board in pre-molded packages is to electrodeposit a circuit on a rigid plastic base and then seal the base with a lid as in FIG. 4A. However, this method has been found to give low yields when used for high lead counts of 80 or more per chip, and can only produce the leadless PCC of FIG. 4A.

SUMMARY OF THE INVENTION

The present invention overcomes the drawbacks and deficiencies of the prior art discussed above by utilizing a flexible circuit in a pre-formed chip carrier cavity package in which the flexible circuit acts as the direct interconnect between the internal IC chip and external bonding pads present on a printed circuit board The chip carrier package of the present invention is comprised of a base, preferably in the shape of a square or rectangular and generally made of plastic, metal or ceramic, having a central die cavity. In some embodiments (FIGS. 5A, 5F, 5G, 5H) the upper surface of the base slopes or curves downwardly from the die cavity toward the four outer edges thereof. An IC chip is disposed in the cavity and held therein by means of a suitable adhesive. A lid generally made from the same material as the base is also provided and has a shape complementary to the upper surface of the base. A flexible circuit sheet is sandwiched between the base and lid. The flex circuit may have a central opening corresponding to the die cavity in the base. In addition, the flex circuit is provided with diagonal slits and/or various other cutouts to permit bending of the flex circuit in two dimensions. Printed circuitry on the flex circuit forms the interconnects between the bond pads on the IC chip and the outer periphery of the package to enable the package to be surface mounted. The base is formed in such a manner as to define very precise interconnect points while at the same time allowing sufficient clearance between the base and the IC board to reduce thermal stress and also to facilitate rapid solvent removal of solder flux. The flex circuit may be connected to the chip I/O leads by any suitable technique, including gold or aluminum wire bonding, conductive adhesives, or conventional tape automated bonding (TAB). Finally, the circuit film is bonded between the lid and the base by means of a suitable adhesive to provide a sealed environment for the chip.

The novel pre-formed chip carriers of the present invention are designed for surface mounting on PC boards or other circuit substrates. The present invention is particularly suited for use with chips which are larger than 150 mils on the longest edge, which require between about 80 and 320 or more electrical connections between the die surface and the external mounting surface; and which have leads arranged along all four edges.

The present invention includes pre-formed chip carriers which may have the dimensions, outline, and external lead configurations as desired. While the most widely used application for the packages of this invention will be for packages containing a single IC chip, it will be appreciated from the following description that the present invention has particular advantages for multi-chip packages because it facilitates a large number of interconnections between the IC chips within the package.

The features and advantages of the present invention will be further appreciated and better understood by those in the art from the following drawings and detailed description.

BRIEF DESCRIPTION OF THE DRAWINGS

Referring now to the drawings, in which like elements have like reference numerals:

FIGS. 3A through 3H are plan views of eight of the flexible circuit sheets for use in conjunction with the IC packages of the present invention, with the circuits of FIGS. 3A-H differing in the method of diagonal slitting utilized to permit conformation to the various package shapes shown in FIGS. 5A-H.

DESCRIPTION OF THE PREFERRED EMBODIMENTS

Figure 1:
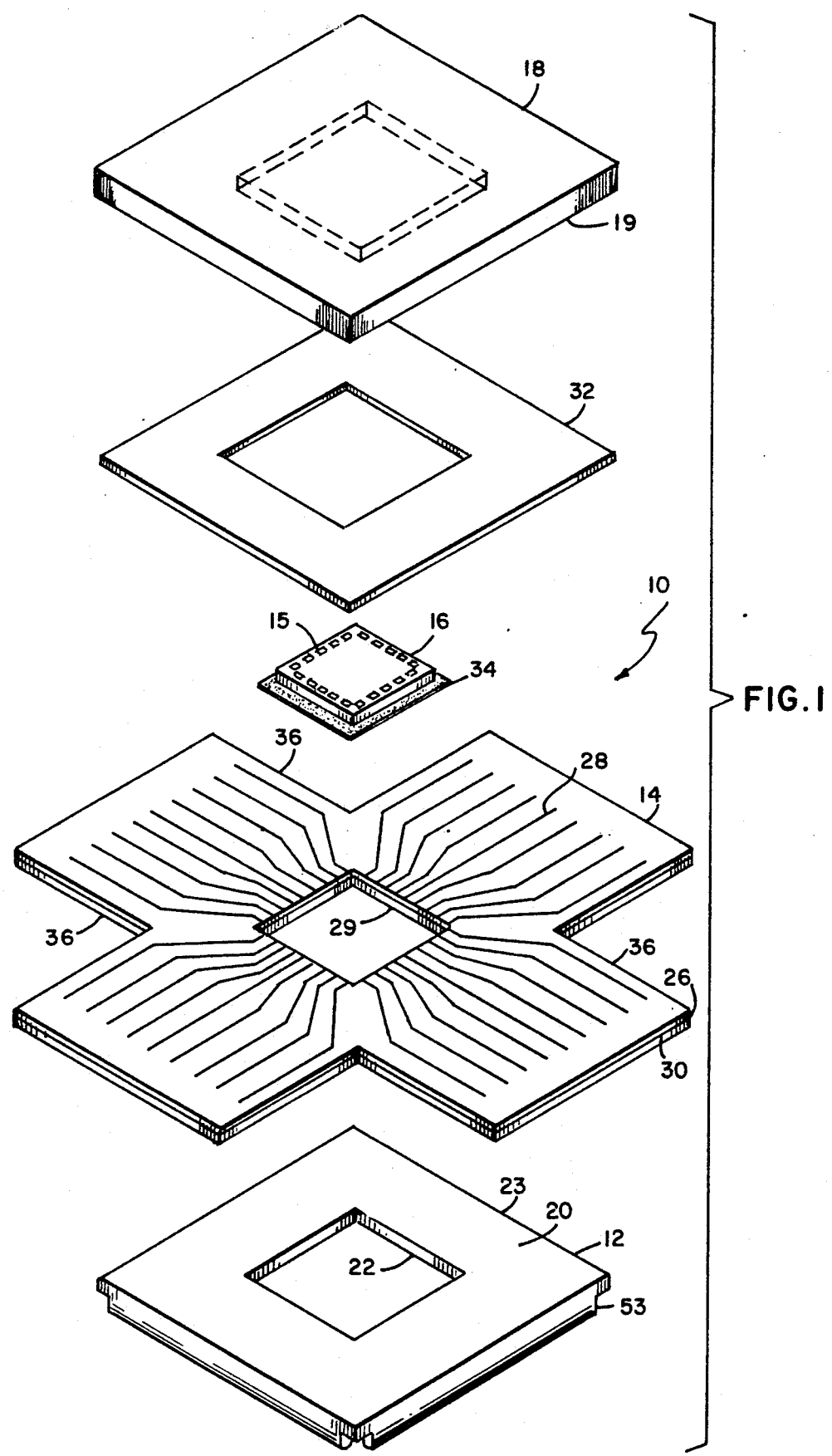
FIG. 1 is an exploded perspective view showing the components for one of the pre-molded IC packages in accordance with the present invention.
Figure 2:
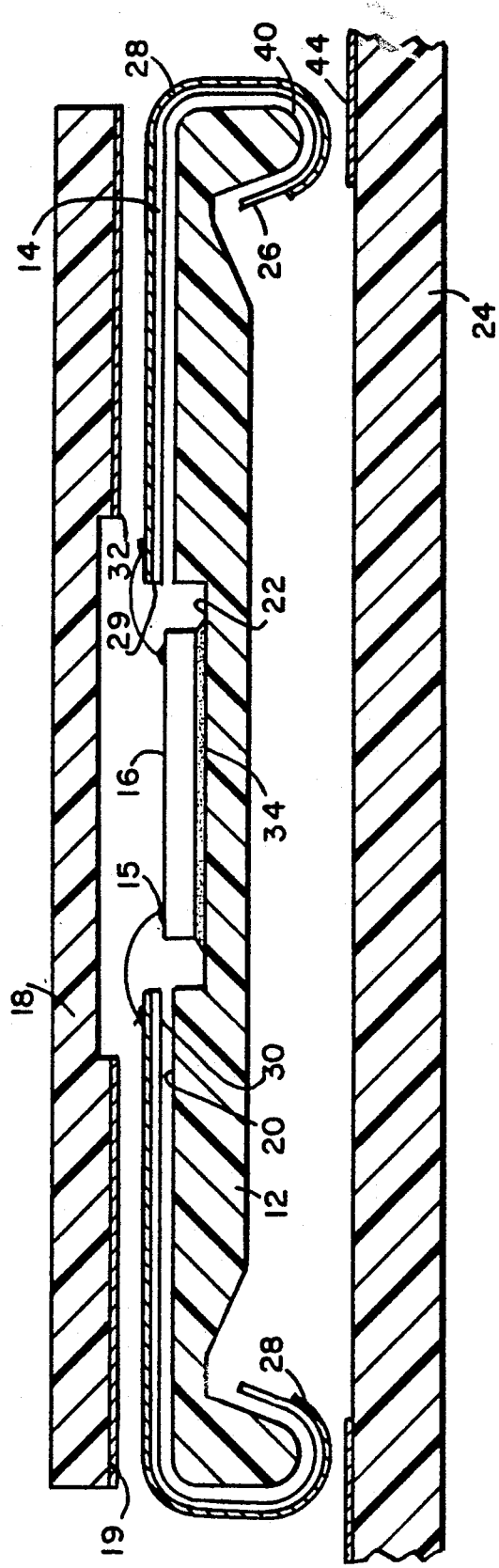
FIG. 2 is a cross-sectional elevation view through the IC package of FIG. 1 subsequent to complete assembly thereof.

Referring first to FIGS. 1 and 2, a novel integrated circuit (IC) package in accordance with the present invention is shown generally at 10. IC package 10 comprises four primary components: a base 12, preferably having a square or rectangular shape, a flexible circuit sheet 14, an integrated circuit die or chip 16, and a lid or cover 18. Base 12 and lid 18 are pre-molded items comprised of suitable materials as known in the art. Examples of such materials include plastics such as polyetherimides (ULTEM of General Electric), polyphenylene sulfides (RYTON of Philips), and thermosetting epoxy-phenolic novolac molding compounds, as well as ceramics such as aluminum oxide, metals such as aluminum, copper or their alloys, or any other suitable heat resistant, high Tg (greater than about 150° C. material which has the dimensional stability, cost, purity, and other properties suitable for use in semiconductor packaging.

As shown, base 12 is a square and includes an upper surface 20 which is shown as flat, but which may slope upwardly or downwardly between the planar peripheral surface 23 and a central die cavity 22, depending upon the configuration desired. Cavity 22 is sized to receive a well-known IC chip 16. IC chip 16 is secured within recess 22 by a suitable die attach adhesive 34 such as AMICON ME-868, an aluminum oxide-filled epoxy, or AMICON C-990, a silver-filled epoxy, both sold for die attach by W.R. Grace & Co.

Lid 18 preferably has a lower surface 19 which is shaped complementary to the upper surface 20 of base 12. While base 12 of FIGS. 1 and 2 show a cavity 22 for holding IC chip 16, it will be appreciated that cavity 22 may be included alternatively in lid 18 or may be found in both base 12 and lid 18 (FIGS. 5A-F). In addition, the die face may be oriented facing either up (FIGS. 5C-5G) or down (FIGS. 5A, 5B, and 5H) for heat transfer or other purposes.

One of the essential features of the present invention relates to the use of a flexible circuit 14 which is sandwiched between base 12 and lid 18 and is used to form the electrical interconnections between IC chip 16 and an external circuit board which is shown at 24 in FIG. 2. Since flexible circuit 14 acts as a direct interconnect between the I/O pads on the interior IC chip 16 and the bonding pads 44 on the exterior circuit board, it must extend outwardly of the pre-molded chip carrier package and must travel between a first level coplanar with IC chip 16 and a second lower level coplanar with the exterior circuit (e.g. PC circuit board). This can be accomplished in several ways including forming the flex circuit larger than the carrier package as shown in FIGS. 1-2.

Flexible circuit 14 includes an optional central cut out 29, shown in FIG. 1, in alignment with central recess 22 of base 12. Flex circuit 14 comprises a flexible plastic film or substrate 26 which is preferably composed of a heat resistant polymeric film such as a polyimide film; e.g. KAPTON sold by Dupont. Substrate 26 preferably has a thickness of between about 1 to 5 mils and is provided with a circuit 28 thereon using any known and conventional additive or subtractive circuit forming technique. Circuit 28 may be composed of any suitable electrically conductive material, but is preferably a metal material, and most preferably copper. The construction of circuit 28, various circuit patterns, and the manufacture of the flex circuit is discussed in greater detail with reference to FIGS. 6A and 6B.

Lid 18 and base 12 have complementary surfaces which are designed to mate and hold flex circuit 14 therebetween so as to permit the formation of a high integrity seal between circuit sheet 14 and lid 18 and between circuit sheet 14 and base 12. This high integrity seal is achieved by use of suitable adhesive materials 30 and 32, such as AMICON ME-150 liquid epoxy and/or AMICON TG-150 solid epoxy, both sold by W.R. Grace & Co., which act to form a sealed five (5) layer sandwich construction of lid 18, adhesive 32, circuit sheet 14, adhesive 30, and base 12.

Figure 3E:
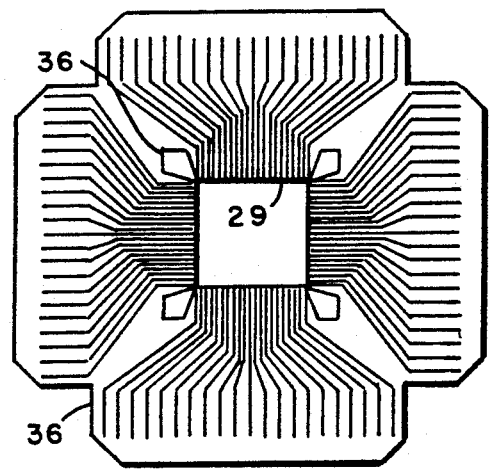
Figure 3F:
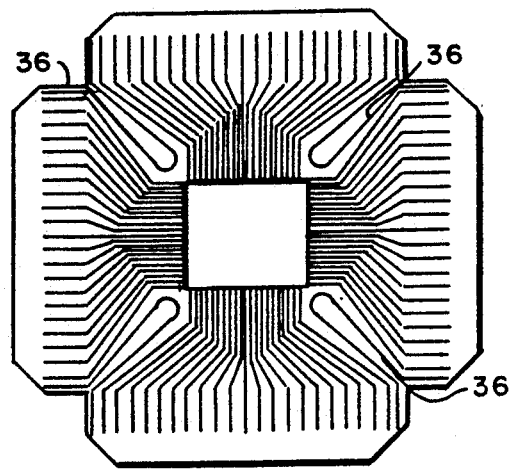
Figure 3G:
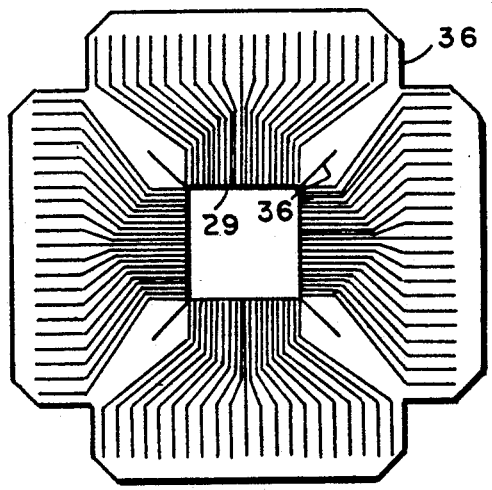

Another important feature of flexible circuit sheet 14 is a provision which permits flex circuit 14 to conform to the complementary shapes of base 12 and lid 18 without tearing or creasing. This is accomplished by providing, using suitable means such as cutting or punching, four or more diagonal slits or cutouts 36 partially through flex circuit 14. In FIGS. 3A, 3E, 3G, and 3H slits 36 are shown originating from central cut out section 29 towards the four diagonal corners. Alternatively, the slits or cutouts may originate at the four corner cutouts 36 and run towards the center of flex circuit sheet 14. An example of this alternative flex circuit embodiment is shown in FIG. 3F. Other slits or cutout arrangements which enable flex circuit 14 to conform to the complementary shape of the base and lid are within the scope of this invention.

The printed circuitry 28 on flex circuit 14 may be interconnected with the I/O leads on IC chip 16 by any suitable method. For example and as shown in FIG. 2, flex circuit 14 may be connected to the I/O lead pads 15 of IC chip 16 by gold or aluminum wire bonding techniques (FIGS. 5A-D and 5F-H also show this type of connection) or by conventional tape automated bonding (TAB) techniques (FIG. 5E), or by using an electrically conductive adhesive (not shown) to attach the metal inner leads to the bond pads 15 on the die surface.

Figure 4A:
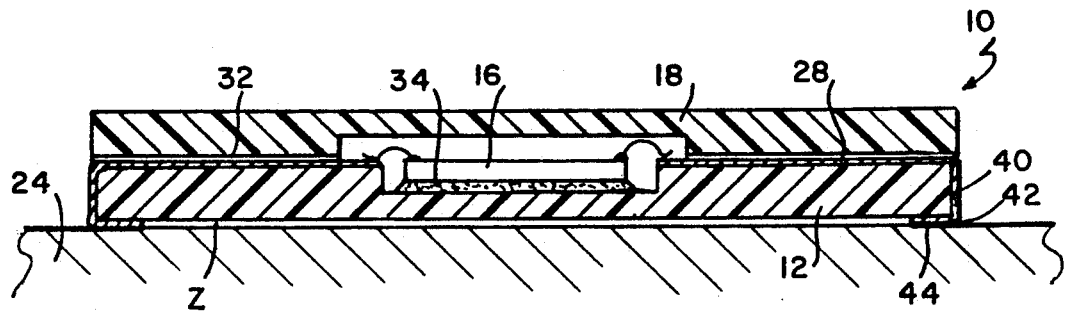
FIGS. 4A and 4B are cross-sectional elevation views of two present standard types of surface mounted chip carriers
Figure 5A:
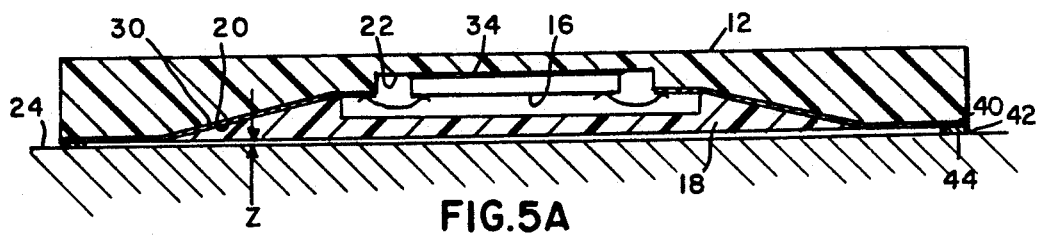
FIGS. 5A through 5H are cross-sectional elevation views of eight embodiments of IC packages of the present invention.

FIGS. 5A-H show other embodiments wherein the flex circuit is larger than the carrier package. In FIG. 5A, a carrier package similar to the prior art "leadless" PCC of FIG. 4A is shown. Die 16 is attached by adhesive 34 and faces downwardly. Gold wires are used to connect the die surface pads to flex circuit 14. Lid 18 is configured such that its perimeter terminates short of the outer perimeter of base 12. The flex circuit 14 is formed as shown in FIG. 3A and is sized to be commensurate with the outer perimeter of base 12 extending outwardly of lid 18. Solder contact points 40 are provided at the terminations of circuit 28 on flex circuit 14 for mating with solder pads 44 by means of solder joints 42 on printed circuit board 24.

Figure 4B:
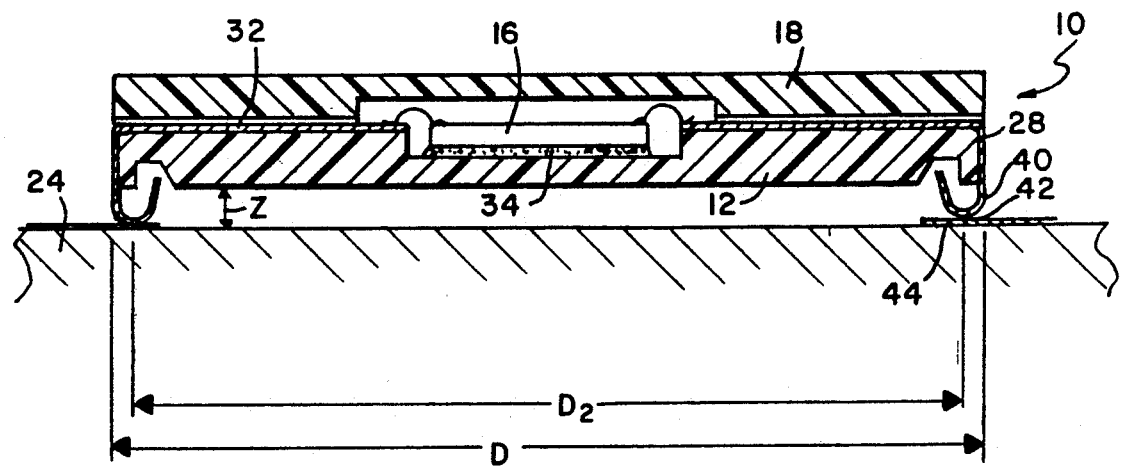
Figure 5B:
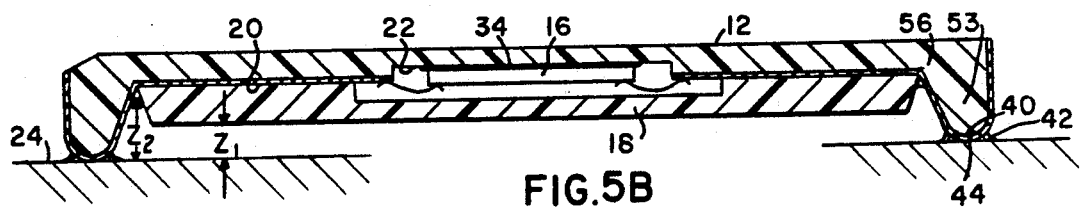

The embodiment shown in FIG. 5A represents an improvement over prior art packages because of the use of flex circuit 14 which permits a smooth transition from the plane of the die 16 to the plane of the circuit board 24. However, it possesses the disadvantages discussed above for the leadless package of FIG. 4A, which are directly attributed to the shape of the circuit film in the area of solder pads 44. This particular disadvantage is not possessed by the embodiment of FIGS. 1 and 2, which depict a leaded carrier similar to that of the prior art carrier shown in FIG. 4B. FIG. 5B shows a leaded carrier similar to FIGS. 1 and 2.

In FIG. 5B, as shown, the shape of the lid 18 and base 12 have been changed to form a relatively narrow and flexible ridge around the four outer edges of the package. By providing cuts/slits in flexible circuit 14 as shown in FIG. 3B and wrapping the circuit film around the edges 53 of base 12 as shown in FIG. 2, it is possible to form rounded contact points 40 which closely resemble the contact points and PLCC of FIG. 4B. Lid 18 and base 12 are joined together by means of a suitable adhesive 32 to form a high integrity seal. This embodiment permits the dimensions D and $D_2$ of FIG. 4B to be set more precisely and also has sufficient bottom clearance $Z_1$ and $Z_2$ between the lid 18 and circuit board 24 for solvent entry to remove the solder flux. To accomplish the solder flux removal, $Z_1$ will generally be at least about 20 and up to about 100 mils, preferably at least about 3 and up to about 85 mils, and most preferably about 50 mils, and $Z_2$ will generally be about 30 to about 120 mils, preferably about 40 to about 110 mils, and most preferably about 60 to 70 mils. Neither of these features is present in the embodiment of FIG. 5A. The thin region 56 behind the ridges in FIG. 5B increases the flexibility and reduces the expansion stresses on the solder joints.

Figure 5C:
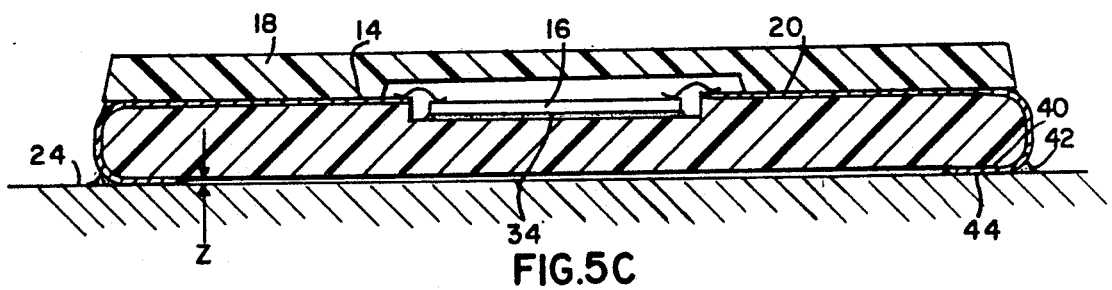

In FIG. 5C, die 16 is wire bonded to flex circuit 14 and base 12 and lid 18 are again commensurate in size. However, die 16 is facing upwardly and flex circuit 14 is bent around the exterior perimeter of base 12 and securely bonded thereto to produce a final configuration resembling a "J-lead" embodiment. While this embodiment does utilize the novel flex circuit feature of the present invention, like the embodiment of FIG. 5A it possesses the disadvantage of leadless package 4A.

Figure 5D:
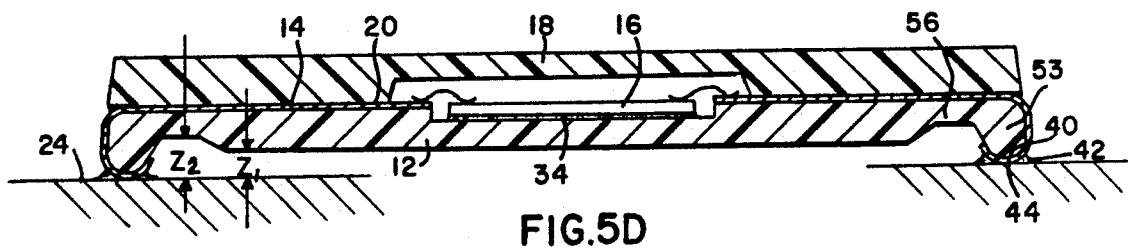

In FIG. 5D the peripheral edges of base 12 are rounded and narrowed to better define localized connection points 40 for providing accurate interconnections between flexible circuit 14 and the solder pads 44 on the exterior circuit 24. The relatively narrowed edges 56 increase flexibility to avoid solder joint cracking. The modified base design of FIG. 5D represents a considerable improvement over the previous designs of FIGS. 5A and 5C. It more closely resembles the JEDEC outline of FIG. 4B with, however, the novel flex circuit of the present invention, and provides improved solderability, flux removal, and shock resistance. The packages of FIGS. 5C and 5D both utilize the same circuit film, which is cut as shown in FIG. 3C-D.

Figure 5E:
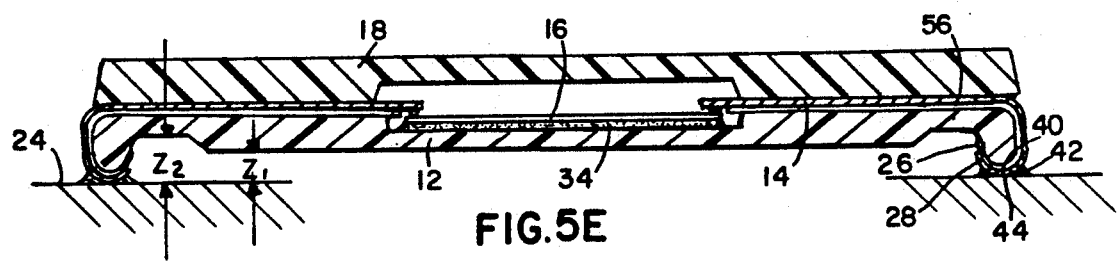

FIG. 5E has outer lead configurations which are respectively identical to FIGS. 5D, F and G. However, unlike in the wire bonded embodiments, IC chip 16 is electrically connected to flex circuit 14 using well-known tape automated bonding techniques. In FIG. 5E the metal inner leads are cantilevered over the pads 15 on IC die 16 surface, and thermo-compression bonded to gold bumps which have been pre-deposited on the die pads via standard TAB procedures for bumping the die pads. To facilitate locating the metal inner leads over the gold bumps, the circuit film 14 is cut as shown in FIG. 3E.

Figure 5F:
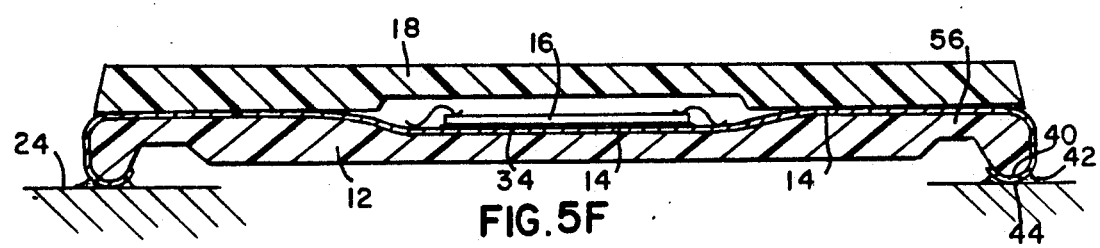

FIG. 5F depicts one of the many other configurations of the present invention made by combining features of FIGS. 5A-E. In this embodiment the die has been mounted on top of the circuit film 14, rather than through a central cut-out. Hence, in this case it is necessary to have the circuit film cut with diagonal and corner cut-outs 36 as shown in FIG. 3F.

Figure 5G:
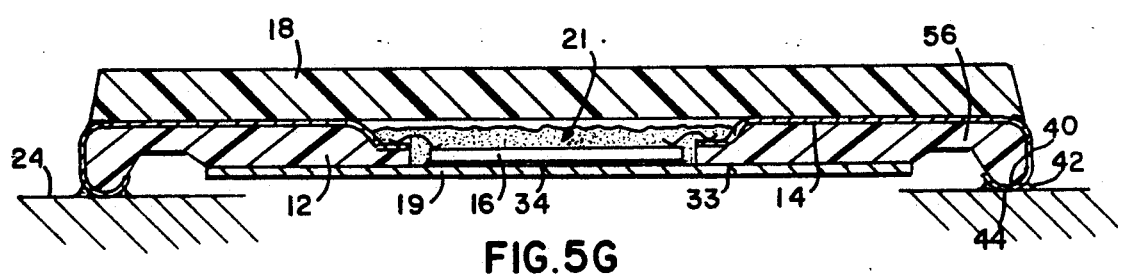
Figure 5H:
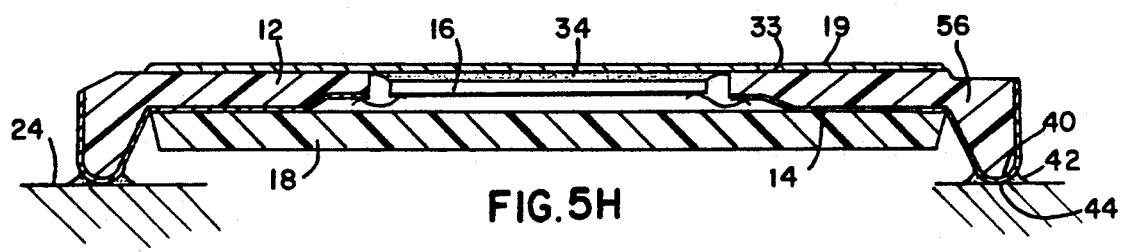

In all of the embodiments shown in FIGS. 5A-F a die cavity has been provided in both base 12 and lid 18. In FIGS. 5G and 5H, the cavity is in the base only. In a preferred embodiment the die is oriented face down in an effort to improve heat removal through the upper surface.

FIG. 5G shows an embodiment similar to that of FIG. 5D except that the base 12 has a deeper cavity. The bottom of the cavity is closed by a heat sink member 19 which is attached to the base 12 by a suitable adhesive 33. The heat sink is preferably a metal sheet such as of copper or aluminum and serves to increase heat dissipation from the die 16. For electrical isolation purposes, the die 16 is attached to the heat sink 19 by a die attach adhesive 34 such as AMICON TC-86 which is thermally, but not electrically conductive. The circuit film 14 needed to fit the contours of the base 12 in FIG. 5G has the diagonal cuts and cut-outs 36 shown in FIG. 3G. Also shown in this embodiment is a silicone gel 21 which is used to encapsulate the die 16 and to provide added passivity and moisture protection.

Figure 3H:
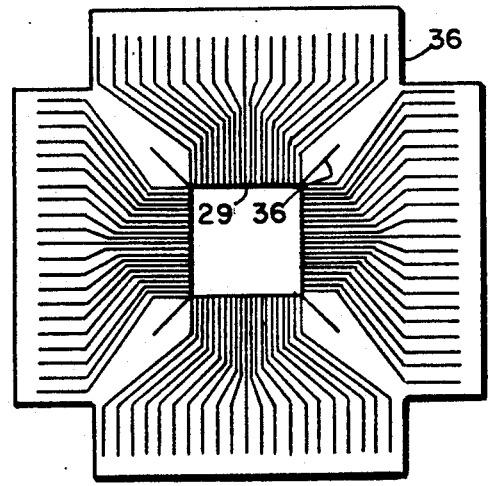

FIG. 5H shows a package similar to that of FIG. 5B except that the cavity 22 in the base 12 has been deepened to permit the die to be attached to a copper or aluminum heat sink 19, typically 5 to 25 mils thick, using a thermally conductive but electrically insulating adhesive as in the embodiment of FIG. 5G. The heat sink 19 permits this package to dissipate more heat than can the all-plastic design of FIG. 5B. The circuit film 14 needed for FIG. 5H must be cut as shown in FIG. 3H.

As is clear from the foregoing discussion of FIGS. 5A-H, there are several methods of positioning the unitary flexible circuit between a first level coplanar with the IC chip and a second lower level coplanar with the exterior circuit board (usually a PC board). One method shown in FIG. 5A is to form the complementary facing surface of the base and lid as a downward slope. Another method shown in FIGS. 5B, C, D, and E is to maintain the flexible circuit at the same level within the package then wrap the circuit around the outer edges of the base to form solderable leads at the exterior of the package. In FIGS. 5F, G, and H the circuit film has additional diagonal cuts to adjust the height, within the package, of the circuit leads relative to the top surface of the die. As a result of the above cuts and construction steps, the flex circuit emerges from the package to form external leads which conform to the dimensions specified in JEDEC or other industry standards. This permits the package to be surface mounted with precision and with no further cutting or lead bending using existing solder reflow methods to standard circuit boards. Accordingly, the packages of the present invention can be sold by the IC manufacturer to the circuit board manufacturer in a form ready for surface mounting with no added steps, costs, or production equipment.

Figure 6A:
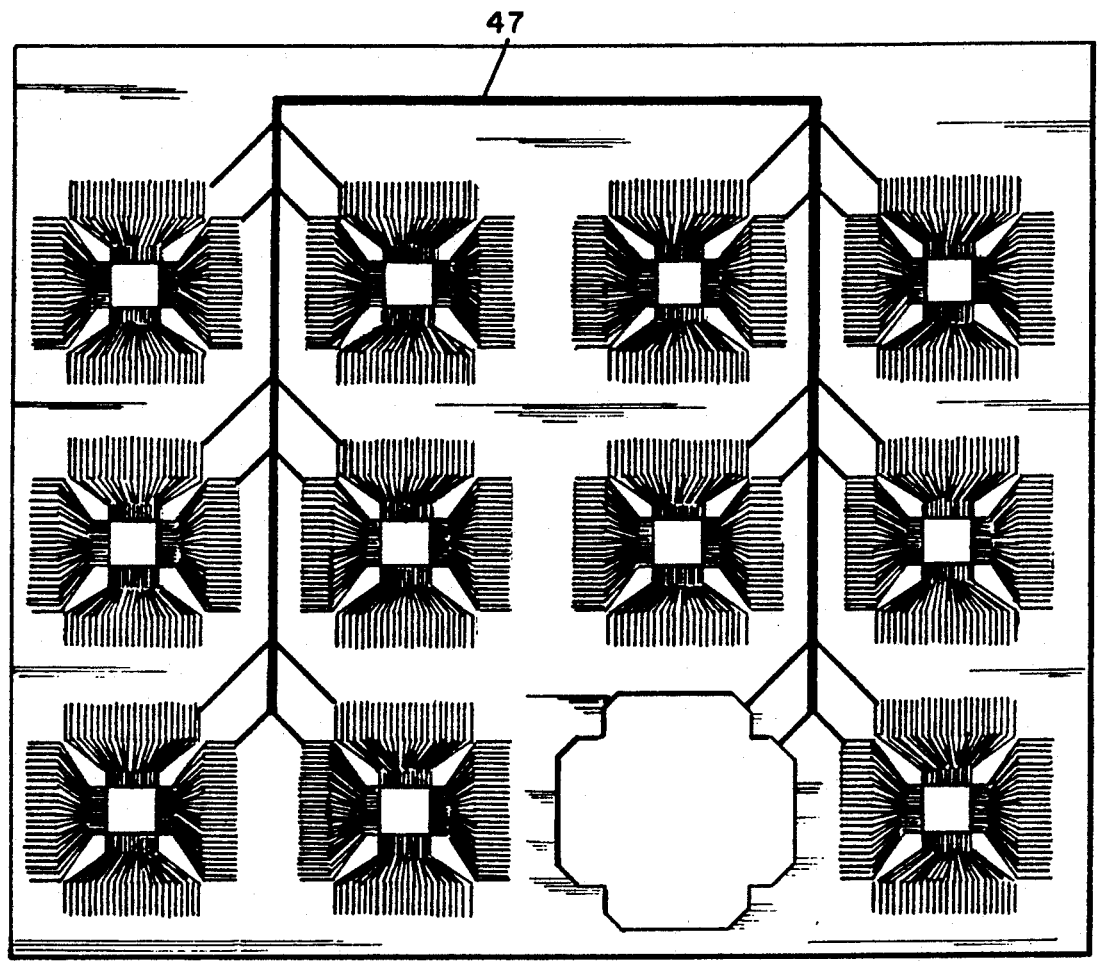
FIG. 6 is a plan view of a circuit sheet containing a large number of individual circuits.
Figure 6B:
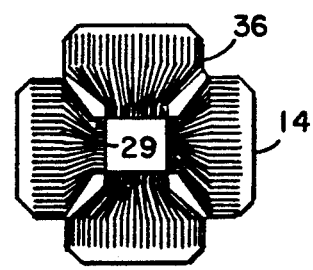

For many applications and as shown in FIGS. 1 and 2, the flexible circuit 14 may have a bare copper circuit pattern 28. To facilitate gold or aluminum wire bonding to the inner lead areas or to improve solder wetting at the outer lead areas 40, it may be desirable to pre-tin the outer lead areas 40 or to gold plate the entire circuit 28. Electroplating the individual copper circuit lines may be done as shown in FIGS. 6A and 6B. FIG. 6A is a plan view of a circuit sheet 13 containing twelve identical circuits. All copper lines are joined to a single tie bar 47 and hence can be plated first with nickel and then with gold by immersing the circuit sheet 13 in a plating bath and holding the tie bar 47 at the appropriate D.C. voltage. After plating, the sheet 13 may be cut into strips or individual circuits 14 as shown in FIG. 6B, which also corresponds to the cuts of FIGS. 3C and D. In FIG. 6B, the connecting ring and bars have been cut away to establish 84 individual circuit lines.

FIG. 6B shows a circuit having 84 leads on 50 mil outer lead pitch and 18 mil inner lead pitch. The circuit 14 fits the package of FIG. 5D with the JEDEC dimension D=1.190". Many other lead counts are also possible. By simply changing the photoresist pattern, a circuit of the same size, fitting the same D = 1.190" square package could be made with 160 to 168 leads on 25 mil outer lead pitch and 9 mil inner lead pitch. Other combinations include 200 leads on 20 mil pitch and 300 leads on 13 mil outer lead pitch.

The package and the circuit need not be square as shown. They may be rectangular with more leads on the horizontal than the vertical sides. If gold plating is not used, the circuit need not have the connecting bars 47 of FIG. 6A. All copper leads need not be of the same shape and width, as shown in the multi-chip circuit of FIG. 7.

Total lead count is presently limited by solderability and wire bond limitations. Inner leads on closer than 6 mil centers have been found to be difficult to wire bond. Outer leads on less than about 12 mil pitch are difficult to solder by present surface mount techniques. These factors limit the maximum number of leads to about 320. However, if the industry overcomes the problems associated with having high lead counts by the use of new technology, the present invention may have applicability with greater than 320 lead counts.

Figure 7A:
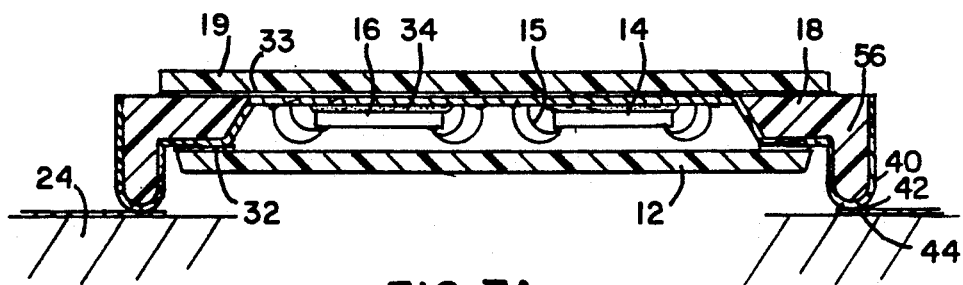
FIG. 7A is a side elevation view of a multi-chip embodiment of the present invention.
Figure 7B:
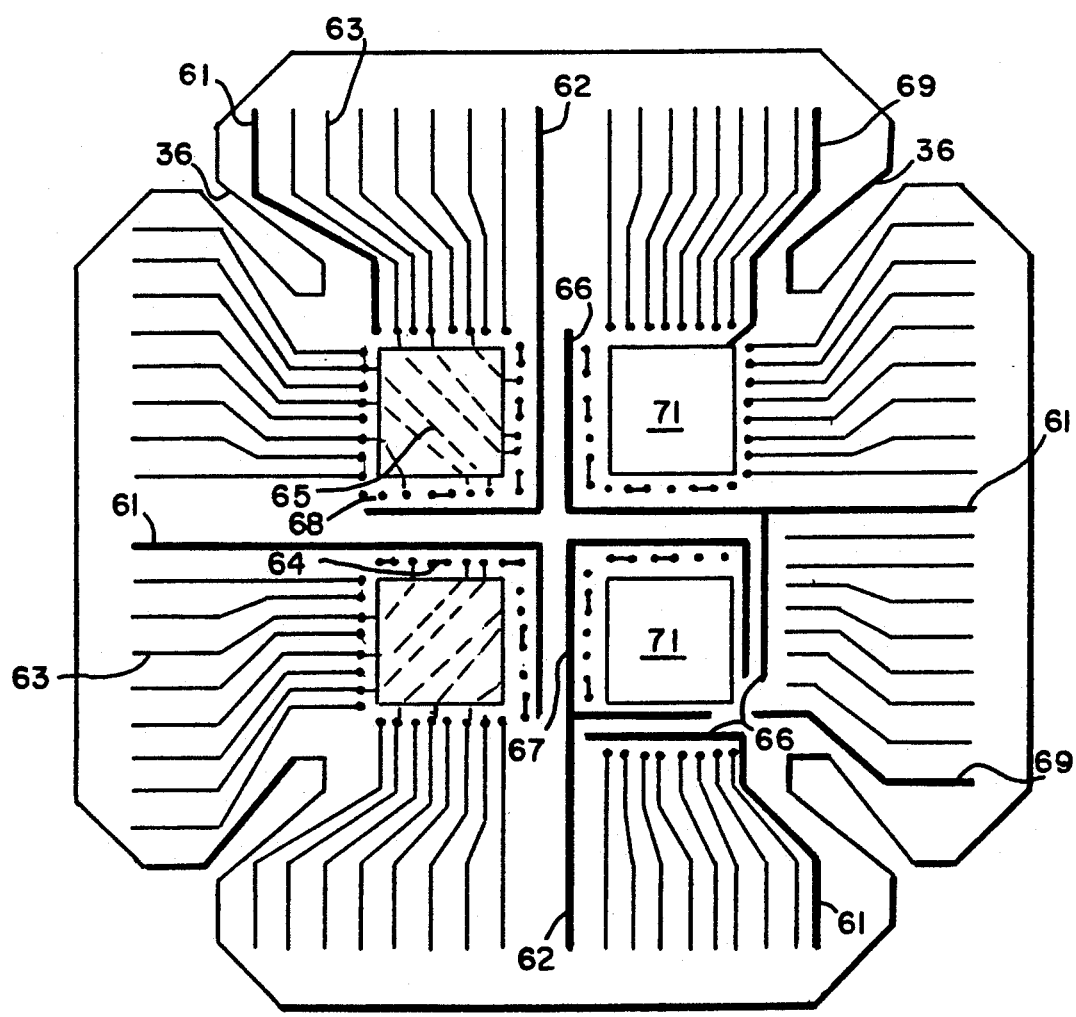
FIG. 7B is a plan view of the flex circuit of the embodiment of FIG. 7A.

The carrier package of the present invention and the method of construction described herein are particularly suited for multi-chip packages because of the possibilities for interconnections between dies within a single package. FIGS. 7A and 7B show a four-chip package as one of the embodiments of this invention. The package of FIG. 7A is similar to that of FIG. 5H and the flex circuit is cut as in FIG. 3F. However, any of the designs of FIGS. 5A-H could be used by enlargement of the base and die cavity and by appropriate circuit layout and film cutting.

As shown in FIGS. 7A and 7B, the overall package is 1.90" square and the central die cavity is 1.00" square. It contains four dies 65, each 300 mils square. There are 320 outer leads on 20 mil outer lead pitch and 12 mil inner lead pitch. The leads include four ground leads 61, two power leads 62, and two ground plane leads 69, each of which is three times the width of the 312 signal leads 63. The ground and power leads connect to a set of central bus bars 66 and 67. Some of the signal leads 63 continue under the die 65 to connect to inner bond pads 68. The inner rows also include jumper pads 64 which allow connections between adjacent dies. Almost every bond pad 15 on each of the four die surfaces, therefore, has access to signal, ground, power or to interconnect. This complex architecture has never been incorporated into a surface mounted pre-molded plastic chip carrier. A four-chip package having equivalent circuitry to that shown in FIGS. 7A and 7B has previously required very much more expensive ceramic multi-layer packaging.

Many variations of the multi-chip package are of course possible. The cavity 22 may contain more or less than four dies. The cavity may contain a silicone gel (not shown) as in the embodiment of FIG. 5G, for added passivation. The dies may be of different size and type. For example, a mixture of logic and memory dies may be employed. The cavity may also contain capacitors or other passive components. To pass leads under the dies in FIG. 7, it is necessary to use a die attach adhesive 34 which electrically isolates the die from the underlying conductors 63. If back plane conductivity is required, as for certain MOS chips, the circuit can provide a conductive die pad 71 tied to a ground plane lead 69, and the die can be attached with a conventional silver-filled adhesive. The package may be designed for TAB as in FIG. 5E, or for gold or aluminum wire bonding. The package may be all plastic, or plastic/metal as in FIG. 7A, or all metal as in FIG. 8.

All of the embodiments previously described herein involved first cutting, then bending the flex circuit in order to fit it into, or wrap it around a pre-formed, usually molded plastic, base. The embodiment described in FIGS. 8A through 8G allow for a different means of construction whereby the flex circuit is bonded to a flat metal, preferably copper, support and then bent to form the outer leads. As shown in FIG. 8, package 83 comprises a lid 78 and a base 75. The base 75, unlike in the previous embodiments, must be constructed of metal such as copper, aluminum, and alloys of copper and/or aluminum. It is presently preferred to use a copper base which is preferably about 8 mils thick. The 8 mil thickness is preferred for shaping, stamping, cost, and forming reasons and also because 8 mils is a standard thickness for copper alloy lead frames. The die 16 is bonded by means of an adhesive to base 75 and attached to flex circuit 14 by means of gold or aluminum wire bonds. Flex circuit 14 is attached to base 75 by means of a suitable adhesive and wrapped around the base 75 and solder bonded to circuit board 24 at points 44.

An on-line assembly method may be used to manufacture the package shown in FIG. 8. As described in greater detail in Example II below, the package may be produced by first cutting and then bonding the flex circuit 14 to a flat copper strip 70, followed by die attachment, wire bonding, and then lid seal. This can all be done while the film and copper support are in a flat strip or roll form. The strip is then cut and the outer leads are bent using conventional lead forming equipment. The all-metal construction may also be used to form multi-chip packages as in FIG. 7.

The all-metal construction has advantages in heat transfer and hermeticity over plastic packages. It lends itself to low cost and high assembly rates, using the same equipment now used to die attach, wire bond, and to cut and bend the outer leads on conventional lead frame strips.

There are a variety of methods which may be used in constructing the novel pre-molded IC chip packages of the present invention. One method of using the present invention is explained in Example I with references to FIGS. 1, 2, 3C, 3D, 6A and 6B.

EXAMPLE I

A 1 mil thick sheet of rolled copper is laminated to a 2 mil thick film of Kapton using a suitable thermosetting laminating adhesive. The copper side of the laminate is then selectively etched, using standard photo-resist methods, to produce a sheet 8" × 11" in size. One surface contains 24 identical copper circuit patterns, arranged in 4 rows of 6 each. Each circuit is identical to the circuit shown in FIG. 6B and the 24 circuits are interconnected as shown in FIG. 6A. All exposed copper surfaces are plated first with 60 microinches of nickel and then with 30 microinches of gold by standard electrodeposition. The sheet 14 is later coated on the rear (Kapton) side with a suitable epoxy adhesive (AMICON ME-150) which has been dissolved in methylethylketone. After evaporation of the MEK, the remaining epoxy adhesive forms a dry film 30 about 1 mil thick.

As shown in FIG. 6B, the sheet is then die cut into individual circuits, and the circuits are further cut to produce the diagonal slits 36 and center openings 29 shown in FIG. 3C-D.

Referring to FIGS. 1 and 2, bases 12 and lids 18 are injection molded from glass-filled ULTEM resin.

The flex circuit 14 is then carefully aligned, adhesive side 30 down, on the base 12. The corner cut-outs 36 permit all surfaces of the film to conform to the surfaces of the base. Using a suitable fixture the adhesive side of the film is pressed against the base and then heated for 30 minutes at 160° C. to cure the epoxy resin 30 and form a permanent bond between the base and the flex circuit film.

A silicon die 16 having 84 surface I/O pads and measuring 280 × 280 mils in length and width, is bonded into the cavity 22 using AMICON ME-868 epoxy die attach adhesive 34. The adhesive is oven cured for 45 minutes at 175° C. mil diameter aluminum wires are then connected between each of the 84 die pads 15 and the inner terminations of each of the 84 gold plated copper circuit traces on the circuit.

After inspection of the aluminum wire connections, the lid 18, with a pre-applied adhesive preform 32 (such as AMICON TG-150, discussed above, which has been die-cut to conform to the shape of the lid) is then pressed into contact with the base and cured for 30 minutes at 170° C. to seal the package.

To test the quality of the adhesive seal, the finished packages are immersed in a beaker of Fluorinert FC-40 (manufactured by 3M) at 121° C. for 30 seconds. Immersing the package in this clear hot liquid causes the gas in the internal cavity to heat, expand, and try to escape. Any leakage paths can be detected visually by observing bubbles rising from the package through the hot liquid. Packages made as above showed no bubbles and so passed this test.

The finished packages have 84 copper external outer leads at the solder contact points 40. They can be surface mounted by placing these outer leads in contact with 84 small droplets of a conventional tin-lead solder paste which have previously been applied via stencil to a PC board 24. The assembly is then heated to 325° C. in an IR oven to re-flow the solder and thereby form the necessary 84 electrical connections 42 between the package 10 and the board 24.

Many variations on the above method are, of course, possible. Any of the adhesives may be used in the form of a solid tape or pre-form rather than applied from solution. The inner lead connections may be made via the TAB or adhesive methods of FIG. 5E, or with gold wires rather than with aluminum wires. By changing the slitting or die orientation, other package types of FIGS. 5A-H can be made. The package may be assembled individually, or in strips of six or more packages which resemble present copper lead frame strips. Epoxy tape or ribbon adhesive may be used for die attach, in place of the epoxy paste adhesive above. It will be appreciated that such variations will be clear to those skilled in the art after reading the above description and example.

EXAMPLE II

This example describes one method of making an all-metal package similar to that shown in FIGS. 8A-8G.

Figure 8A:
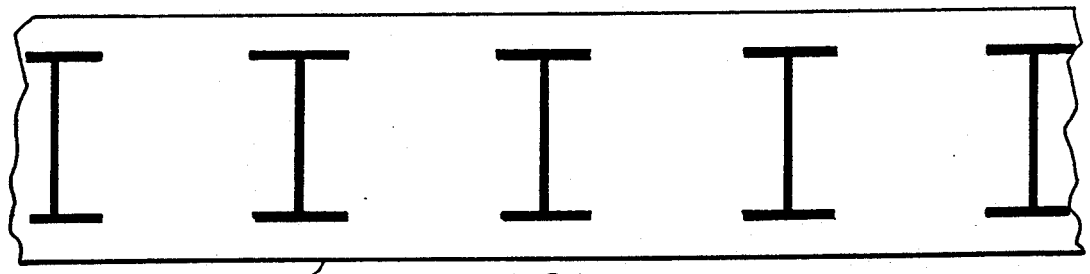
FIG. 8A through 8G are plan and elevation views of the construction of an all-metal embodiment of the invention.
Figure 8B:
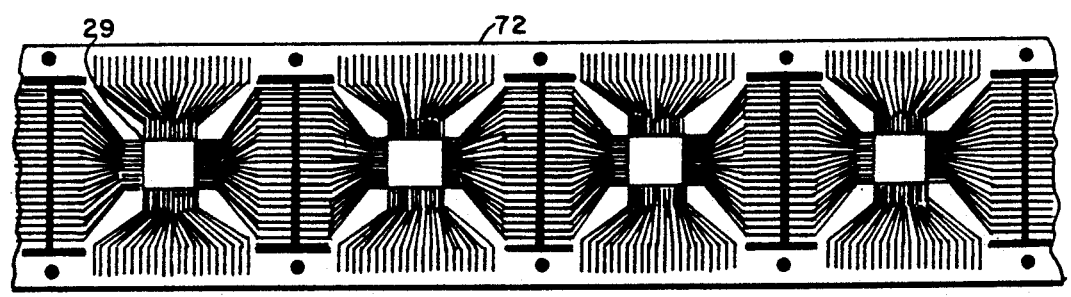
Figure 8C:
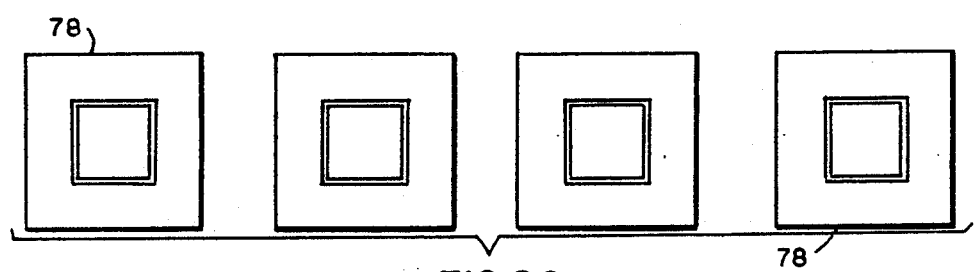

As shown in FIG. 8A, a strip of annealed copper 70, 8 mils thick, is punched to form the shape shown. Independently, the flex circuit sheets of FIG. 6A are coated on the Kapton side with a suitable adhesive, cut into strips 72 as in FIG. 8B, and then bonded to the copper strip 70. The resulting laminated strip 75 now resembles a conventional copper lead frame strip. In a separate operation, copper lids 78 are formed from 8 mil thick copper sheet as shown in FIG. 8C and coated as shown with a high Tg (> about 180° C.) thermoplastic adhesive 79.

Figure 8D:
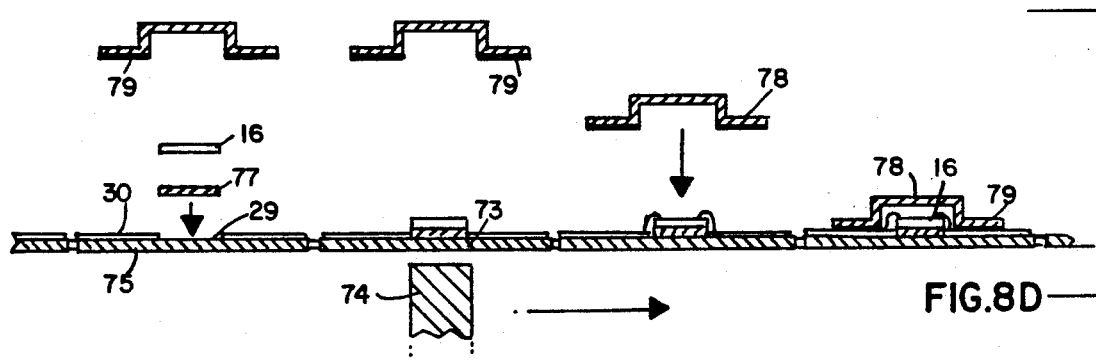
Figure 8E:
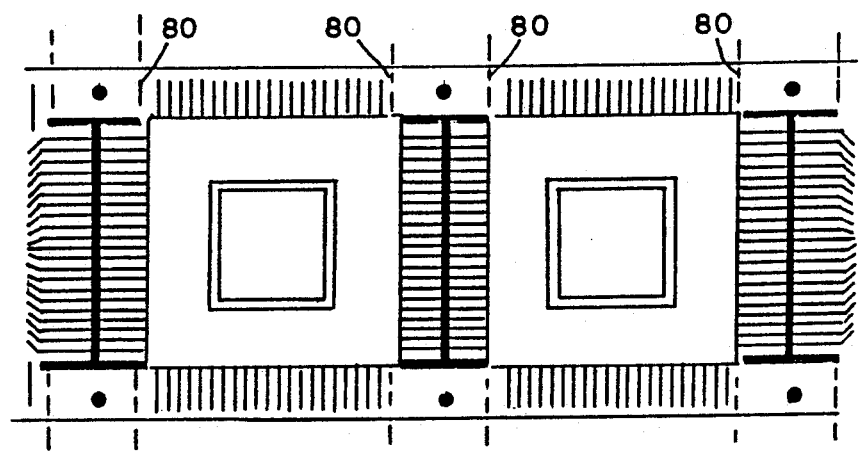

For final production, the die 16 may be attached to the strip 75 through the central opening 29 in the film via a conventional die attach adhesive and the adhesive conventionally cured. But for high-speed on-line assembly, a thermoplastic, aluminum oxide filled, ribbon adhesive, such as AMICON MR-2000, may be used. The ribbon is cut into preforms 77, approximately the size and shape of the die, and the preform and die are placed as shown in FIG. 8D. A heated tool 74 is used to raise the copper area 73, directly under the die, to about 420° C. for one second in a nitrogen atmosphere. This reflows the ribbon adhesive and bonds the die. The strip then moves to the next assembly station for wire bonding and then for lid sealing, which is accomplished as in FIG. 8E, by pressing the lid 78 against the strip 75 for about one second at a temperature above the reflow temperature of the adhesive.

Figure 8F:
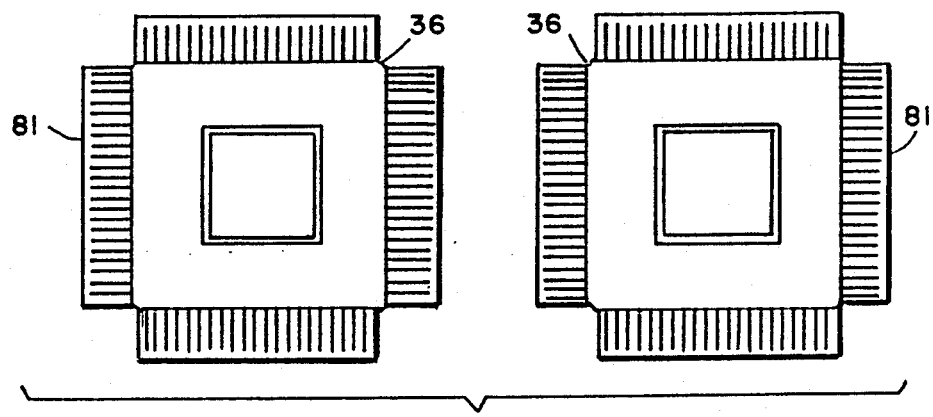
Figure 8G:
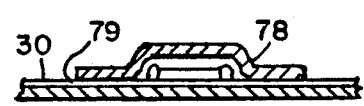
Figure 8G:
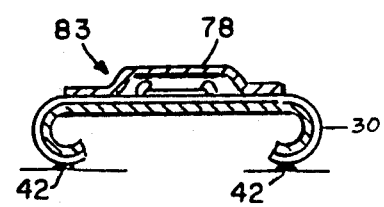

The assembled strip now appears as in FIG. 8F. It is cut along the separation lines 80 to produce the individual units 81 shown in plan view in FIG. 8F and in elevation in FIG. 8G. The four flat edges of the units 81 are then bent to form "J" shaped outer leads to produce the final package 83 shown in FIG. 8G.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A surface mountable integrated circuit chip carrier package having an exterior perimeter and comprising:
   a first body portion, said first body portion having an upper and a lower surface and outer edges;
   a second body portion, said second body portion having an upper and a lower surface and outer edges;
   said upper surface of said first body portion in facing relationship and conforming to said lower surface of said second body portion;
   said first and second body portions being joined together so as to define a chip cavity therebetween for receiving at least one integrated circuit chip;
   at least one integrated circuit chip disposed within the chip cavity;
   a flexible circuit having outer edges and comprising a layer of flexible polymeric film having a conductive circuit pattern thereon sandwiched between said upper surface of said first body portion and said lower surface of said second body portion, said conductive circuit pattern including opposed first and second ends with said second ends extending outwardly from between said first and second body portions and terminating at about the perimeter of the flexible polymeric film for connection to a circuit, said conductive circuit pattern being electrically connected to said integrated circuit chip at said first ends; and
   conforming means for conforming the shape of said flexible circuit to the shape of said upper surface of said first body portion and said lower surface of said second body portion;
   wherein each of said first and second body portions and the flexible circuit have an exterior perimeter at their outer edges and wherein the exterior perimeter of the flexible circuit extends up to or beyond the exterior perimeters of each of said first and second body portions so that the exterior perimeter of the flexible circuit defines the exterior perimeter of the package.

2. The package of claim 1, wherein said flexible circuit pattern is positioned between a first level substantially coplanar with said integrated circuit chip and a second level exterior of said first and second body portions.

3. The package of claim 1, wherein the first and second body portions are joined together through the flexible circuit by an adhesive means.

4. The package of claim 1, wherein said first and second body portions have a generally rectangular configuration.

5. The package of claim 1, wherein said upper surface of said first body portion is sloped outwardly toward its perimeter and said lower surface of said second body portion is sloped outwardly toward its perimeter, said upper surface of said first body portion having a complementary shape with respect to said lower surface of said second body portion.

6. The package of claim 1, wherein said flexible circuit has four outer corners and includes a central opening and wherein said conforming means comprises slits through a portion of said flexible circuit, said slits extending diagonally between each of said flexible circuit corners and said central opening.

7. The package of claim 6 wherein the conforming means additionally comprises cutouts at each of said flexible circuit corners so as to form flaps along each of the edges thereof, the flaps being bendable around the exterior perimeters of one of the body members.

8. The package of claim 7, wherein the flaps of said flexible circuit are bent around and secured to the edge and lower surface of said first body portion.

9. The package of claim 8, wherein the edge of said first body portion has a rounded portion and the flaps of the flexible circuit are bent around and adhesively secured to said rounded portion.

10. The package of claim 1, wherein the first body portion has a recess in its upper surface and the second body portion has a recess in its lower surface corresponding to the first body portion recess, said recess forming the chip cavity when the first and second body portions are joined together 11. The package of claim 1, wherein the first body portion has a recess in its upper surface, said recess forming the chip cavity when the first and second body portions are joined together.

12. The package of claim 1, wherein the second body portion has a recess in its lower surface, said recess forming the chip cavity when the first and second body portions are joined together.

13. The package of claim 1, wherein the integrated circuit chip is bonded to a body portion.

14. The package of claim 1, wherein said integrated circuit ship carrier package is mounted on the surface of an exterior circuit and wherein said second level is coplanar with said exterior circuit.

15. The package of claim 1, wherein said integrated circuit chip is wire bonded to said conductive circuit pattern.

16. The package of claim 1, wherein said integrated circuit chip is tape automated bonded to said conductive pattern.

17. The package of claim 1, wherein at least one of said body portions is shaped so that it extends along and about its perimeter beyond the lower surface of the other body member so as to provide for adequate clearance for solder flux removal between the lower surface of said other body member and an exterior circuit when said package is mounted thereon.

18. The package of claim 17, wherein the flexible circuit is wrapped around the perimeter edges of at least one body member so as to form solder connect points at about the perimeter of the package.

19. The package of claim 1, wherein a means for dissipating heat is attached to at least one of said body portions and the chip is attached thereto.

20. The package of claim 1, wherein the package houses at least four integrated chips in the chip cavity.

21. The package of claim 1, wherein said flexible circuit has four outer corners and includes a central opening and wherein said conforming means comprises slits through a portion of said flexible circuit, said slits extending diagonally between each of said flexible circuit corners and said central opening.

22. The package of claim 21, wherein the conforming means additionally comprises cutouts at each of said flexible circuit corners so as to form flaps along each of the edges thereof, the flaps being bendable around the exterior perimeters of one of the body members.

23. The package of claim 22, wherein each of the flaps have two non-squared corners.

24. The package of claim 22, wherein the flaps of said flexible circuit are bent around and secured to the edge and lower surface of said first body portion.

25. The package of claim 24, wherein the edge of said first body portion has a rounded portion with the flaps of the flexible circuit are bent around and adhesively secured to said rounded portion.

26. The package of claim 1, wherein said upper surface of said first body portion is sloped outwardly toward the perimeter and said lower surface of said second body portion is sloped outwardly toward the perimeter, said upper surface of said first body portion having a complementary shape with respect to said lower surface of said second body portion.

27. A surface mountable integrated circuit chip carrier package comprising:
a first body portion, said first body portion having an upper and a lower surface and outer edges;
a second body portion, said second body portion having an upper and a lower surface and outer edges;
said upper surface of said first body portion in facing relationship and conforming to said lower surface of said second body portion;
said first and second body portions being joined together so as to define a chip cavity therebetween for receiving at least one integrated circuit chip;
at least one integrated circuit chip disposed within the chip cavity;
a flexible circuit having outer edges and comprising a layer of flexible polymeric film having a conductive circuit pattern thereon sandwiched between said upper surface of said first body portion and said lower surface of said second body portion, said conductive circuit pattern including opposed first and second ends with said second ends extending outwardly from between said first and second body portions and terminating at about the perimeter of the flexible polymeric film for connection to a circuit, said conductive circuit pattern being electrically connected to said integrated circuit chip at said first ends; and
conforming means for conforming the shape of said flexible circuit to the shape of said upper surface of said first body portion and said lower surface of said second body portion;
wherein at least one of said body portions is shaped so that it extends along and about its perimeter beyond the lower surface of the other body member so as to provide for adequate clearance for solder flux removal between the lower surface of said other body member and an exterior circuit when said package is mounted thereon.

28. The package of claim 27, wherein each of said first and second body portions and the flexible circuit have exterior perimeters at their outer edges and wherein the exterior perimeter of the flexible circuit extends up to or beyond the exterior perimeter of each of said first and second body portions so that the exterior perimeter of the flexible circuit defines the exterior perimeter of the package.

29. The package of claim 27, wherein said flexible circuit pattern is positioned between a first level substantially coplanar with said integrated circuit chip and a second level exterior of said first and second body portions.

30. The package of claim 27, wherein said first and second body portions have a generally rectangular configuration.

31. The package of claim 27, wherein the first body portion has a recess in its upper surface and the second body portion has a recess in its lower surface corresponding to the first body portion recess, said recess forming the chip cavity when the first and second body portions are joined together.

32. The package of claim 27, wherein the first body portion has a recess in its upper surface, said recess forming the chip cavity when the first and second body portions are joined together.

33. The package of claim 27, wherein the second body portion has a recess in its lower surface, said recess forming the chip cavity when the first and second body portions are joined together.

34. The package of claim 27, wherein the integrated circuit chip is bonded to a body portion.

35. The package of claim 27, wherein said integrated circuit chip carrier package is mounted on the surface of an exterior circuit and wherein said second level is coplanar with said exterior circuit.

36. The package of claim 27, wherein said integrated circuit chip is wire bonded to said conductive circuit pattern.

37. The package of claim 27, wherein said integrated circuit chip is tape automated bonded to said conductive pattern.

38. The package of claim 27, wherein the flexible circuit is wrapped around the perimeter edges of at least one body member so as to form solder connect points at about the perimeter or the package.

39. The package of claim 27, wherein a means for dissipating heat is attached to at least one of said body portions and the chip is attached thereto.

40. The package of claim 27, wherein the package houses at least four integrated chips in the chip cavity.

41. The package of claim 27, wherein the first and second body portions are joined together through the flexible circuit by an adhesive means.

* * * * *